United States Patent
Nishino et al.

(10) Patent No.: US 8,421,339 B2
(45) Date of Patent: Apr. 16, 2013

(54) ORGANIC ELECTROLUMINESCENT DEVICE, EXPOSURE DEVICE, PROCESS CARTRIDGE, IMAGE FORMING APPARATUS, DISPLAY APPARATUS, AND METHOD FOR DRIVING ORGANIC ELECTROLUMINESCENT DEVICE

(75) Inventors: Yohei Nishino, Kanagawa (JP); Hirohito Yoneyama, Kanagawa (JP); Yoshinori Yamaguchi, Kanagawa (JP); Takashi Matsumura, Kanagawa (JP); Kiyokazu Mashimo, Kanagawa (JP); Katsuhiro Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 264 days.

(21) Appl. No.: 12/620,182

(22) Filed: Nov. 17, 2009

(65) Prior Publication Data
US 2010/0327779 A1    Dec. 30, 2010

(30) Foreign Application Priority Data
Jun. 26, 2009    (JP) .................................. 2009-152825

(51) Int. Cl.
*H01L 51/52*    (2006.01)
(52) U.S. Cl.
USPC ........... 313/504; 313/506; 313/512; 313/503; 257/40; 257/78; 257/98; 257/E51.018
(58) Field of Classification Search ............. 313/504, 313/506, 512; 257/40, E51.018, 79, 83, 89; 315/312
See application file for complete search history.

(56) References Cited

U.S. PATENT DOCUMENTS

| | | | |
|---|---|---|---|
| 5,982,345 A | 11/1999 | Takayama et al. | |
| 2003/0094612 A1 | 5/2003 | Yamazaki et al. | |
| 2004/0021762 A1 | 2/2004 | Seki et al. | |
| 2005/0133783 A1 | 6/2005 | Yamazaki et al. | |
| 2005/0258744 A1* | 11/2005 | Kwak et al. | 313/504 |
| 2007/0126355 A1* | 6/2007 | Chiu et al. | 313/512 |
| 2007/0290213 A1* | 12/2007 | Kobayashi | 257/79 |
| 2008/0116788 A1 | 5/2008 | Yamazaki et al. | |
| 2008/0246699 A1* | 10/2008 | Oh | 345/76 |
| 2009/0224276 A1* | 9/2009 | Igari et al. | 257/98 |
| 2010/0308314 A1 | 12/2010 | Yamazaki et al. | |
| 2012/0056204 A1 | 3/2012 | Yamazaki et al. | |

FOREIGN PATENT DOCUMENTS

| | | |
|---|---|---|
| JP | A-09-218664 | 8/1997 |
| JP | A-2003-157983 | 5/2003 |
| JP | A-2003-291404 | 10/2003 |
| JP | A-2005-035206 | 2/2005 |
| JP | A-2006-228457 | 8/2006 |
| JP | A-2008-122836 | 5/2008 |

* cited by examiner

OTHER PUBLICATIONS

Nov. 20, 2012 Office Action issued in Japanese Patent Application No. 2009-152825 (with translation).

*Primary Examiner* — Douglas W Owens
*Assistant Examiner* — Jonathan Cooper
(74) *Attorney, Agent, or Firm* — Oliff & Berridge, PLC

(57) ABSTRACT

An organic electroluminescent device includes: a pair of electrodes; a first light-emitting region that is disposed between the pair of electrodes, and that emits light when a voltage is applied between the pair of electrodes such that one of the pair of electrodes serves as an anode; and a second light-emitting region that is disposed between the pair of electrodes, and that emits light when a voltage is applied between the pair of electrodes such that the other of the pair of electrodes serves as an anode.

16 Claims, 7 Drawing Sheets

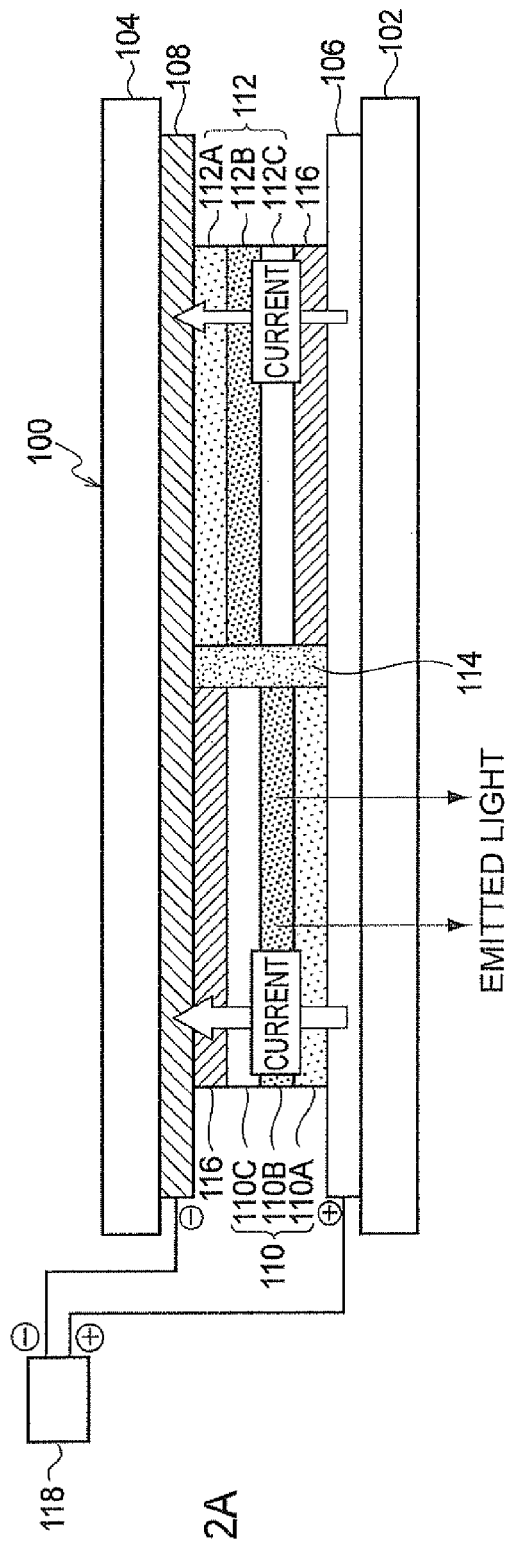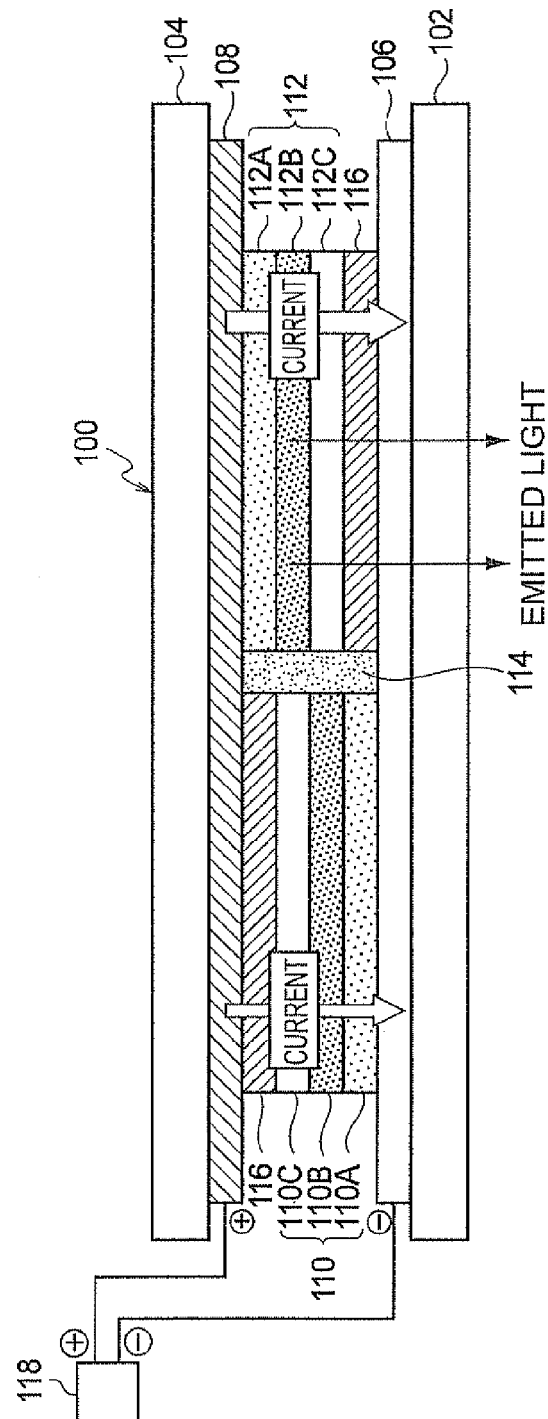

ORGANIC ELECTROLUMINESCENT DEVICE, EXPOSURE DEVICE, PROCESS CARTRIDGE, IMAGE FORMING APPARATUS, DISPLAY APPARATUS, AND METHOD FOR DRIVING ORGANIC ELECTROLUMINESCENT DEVICE

CROSS-REFERENCE TO RELATED APPLICATION

This application is based on and claims priority under 35 USC 119 from Japanese Patent Application No. 2009-152825 filed Jun. 26, 2009.

BACKGROUND

1. Technical Field

The present invention relates to an organic electroluminescent device, an exposure device, a process cartridge, an image forming apparatus, a display apparatus, and a method for driving an organic electroluminescent device.

2. Related Art

An organic electroluminescent device is a charge-injection-type light emitting device that in which an organic compound layer is provided between a positive electrode and a negative electrode. In the organic electroluminescent device, holes and electrons are injected into the organic compound layer by applying a voltage between the two electrodes, and these charges (carriers) recombine to emit light.

SUMMARY

According to an aspect of the invention, there is provided an organic electroluminescent device, including:
a pair of electrodes;
a first light-emitting region that is disposed between the pair of electrodes, and that emits light when a voltage is applied between the pair of electrodes such that one of the pair of electrodes serves as an anode; and
a second light-emitting region that is disposed between the pair of electrodes, and that emits light when a voltage is applied between the pair of electrodes such that the other of the pair of electrodes serves as an anode.

BRIEF DESCRIPTION OF THE DRAWINGS

Exemplary embodiments of the present invention will be described in detail based on the following figures, wherein:

FIGS. 2A and 2B are schematic diagrams for explaining a method for driving the organic electroluminescent device according to the present exemplary embodiment;

DETAILED DESCRIPTION

Exemplary embodiments of the invention will be described in detail with reference to the attached drawings. In addition, members having substantially the same function will be designated by the same numerical reference throughout the drawings, and redundant descriptions thereof may be omitted.

Figure 1:
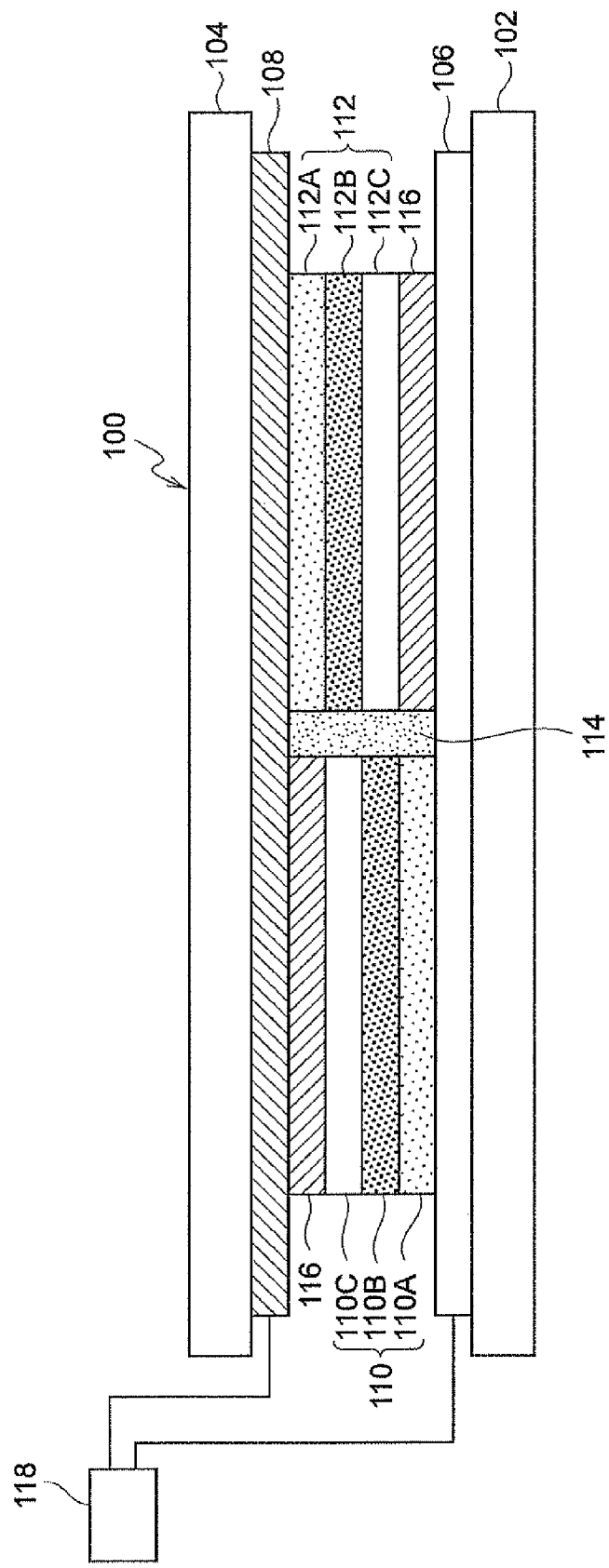
FIG. 1 is an outline view showing the configuration of an organic electroluminescent device according to an exemplary embodiment of the invention.

FIG. 1 is an outline view showing the configuration of an organic electroluminescent device according to the present exemplary embodiment. FIG. 2A and FIG. 2B are schematic diagrams for explaining a method for driving the organic electroluminescent device according to the present exemplary embodiment.

The organic electroluminescent device 100 according to the present exemplary embodiment includes, for example, a transparent substrate 102 provided with a transparent electrode 106 and a rear substrate 104 provided with a rear electrode 108, which are disposed such that the electrodes face each other, as shown in FIG. 1. Between the transparent electrode 106 and the rear electrode 108, for example, a first light-emitting region 110 and a second light-emitting region 112 are disposed adjacently, with a barrier layer 114 interposed therebetween. The first light-emitting region 110 and the second light-emitting region 112 are arranged in a direction intersecting (for example, perpendicular to) the direction in which the transparent electrode 106 and the rear electrode 108 face each other. As a result, the transparent electrode 106 and the rear electrode 108 function as common electrodes for the first light-emitting region 110 and the second light-emitting region 112.

The first light-emitting region 110 is a light-emitting region that emits light when a voltage is applied between the transparent electrode 106 and the rear electrode 108 such that the transparent electrode 106 serves as an anode (and, resultantly, such that the rear electrode 108 serves as a cathode). That is, the first light-emitting region 110 is a charge-injection-type light-emitting region that emits light by recombination of injected holes and injected electrons in the light emitting layer when a voltage is applied between the transparent electrode 106 and the rear electrode 108 such that the transparent electrode 106 serves as an anode and the rear electrode 108 serves as a cathode, i.e., when electric current flows from the transparent electrode 106 to the rear electrode 108. Furthermore, the first light-emitting region 110 is a light-emitting region that does not emit light when a voltage of the opposite polarity, which makes the rear electrode 108 serve as an anode and resultantly makes the transparent electrode 106 serve as a cathode, is applied between the transparent electrode 106 and the rear electrode 108.

Specifically, the first light-emitting region 110 is configured by, for example, a multilayered structure having a hole injection layer 110A, a light emitting layer 110B, and an electron injection layer 110C in this order from the transparent electrode 106 side toward the rear electrode 108 side.

The first light-emitting region 110 is not limited to the configuration described above. The first light-emitting region 110 may be configured by, for example, a multilayered structure having, from the transparent electrode 106 side toward the rear electrode 108 side, 1) at least one of a hole injection layer or a hole transport layer, a light emitting layer, and at least one of an electron injection layer or an electron transport layer in this order; 2) at least one of a hole injection layer or a hole transport layer, and a light emitting layer in this order; or 3) a light emitting layer, and at least one of an electron injection layer or an electron transport layer in this order.

On the other hand, the second light-emitting region 112 is a light-emitting region that emits light when a voltage is applied between the transparent electrode 106 and the rear electrode 108 such that the rear electrode 108 serves as an anode (and, resultantly, such that the transparent electrode 106 serves as a cathode). That is, the second light-emitting region 112 is a charge-injection-type light-emitting region that emits light by recombination of injected holes and electrons in the light emitting layer when a voltage is applied between the rear electrode 108 and the transparent electrode 106 such that the rear electrode 108 serves as an anode and the transparent electrode 106 serves as a cathode, i.e., when electric current flows from the rear electrode 108 to the transparent electrode 106. Furthermore, the second light-emitting region 112 is a light-emitting region that does not emit light when a voltage of the opposite polarity, which makes the transparent electrode 106 serve as an anode and resultantly makes the rear electrode 108 serve as a cathode, is applied between the transparent electrode 106 and the rear electrode 108.

Specifically, the second light-emitting region 112 is configured by, for example, a multilayered structure having a hole injection layer 112A, a light emitting layer 112B, and an electron injection layer 1120 in this order from the rear electrode 108 side toward the transparent electrode 106 side.

The second light-emitting region 112 is not limited to the configuration described above. The second light-emitting region 112 may be configured by, for example, a multilayered structure having, from the rear electrode 108 side toward the transparent electrode 106 side, 1) at least one of a hole injection layer or a hole transport layer, a light emitting layer, and at least one of an electron injection layer or an electron transport layer in this order; 2) at least one of a hole injection layer or a hole transport layer, and a light emitting layer in this order; or 3) a light emitting layer, and at least one of an electron injection layer or an electron transport layer in this order.

Conductive layers 116, for example, are respectively disposed between the first light-emitting region 110 and the rear electrode 108, and between the second light-emitting region 112 and the transparent electrode 106. This conductive layer 116 is provided in order to secure the distance between an end surface of any functional layer of the first light-emitting region 110 and an end surface of the same type of functional layer (for example, a hole injection layer, a hole transport layer, an electron injection layer, an electron transport layer, or the like) of the second light-emitting region 112, which adjoin in a direction intersecting (for example, perpendicular to) the direction in which the transparent electrode 106 and the rear electrode 108 face each other. Electric short circuit between, for example, the electron injection layer of the first light-emitting region 110 and the electron injection layer of the second light-emitting region 112 is suppressed thereby, and changes in the light emission properties, such as light emission from the second light-emitting region 112 when a voltage of the polarity that should cause light emission from the first light-emitting region 110 is applied, may be suppressed.

In addition, the conductive layers 116 also function as thickness adjusting layers such that a multilayered structure composed of the first light-emitting region 110 and one of the conductive layers 116 and another multilayered structure composed of the second light-emitting region 112 and the other of the conductive layers 116 have the same thickness and are both sandwiched between the transparent electrode 106 and the rear electrode 108 with both sides of each multilayered structure closely contacted with the transparent electrode 106 and the rear electrode 108, respectively, even when the layer thicknesses of the first light-emitting region 110 and the second light-emitting region 112 are different.

The organic electroluminescent device 100 according to the present exemplary embodiment has a configuration in which light emitted from the first light-emitting region 110 and light emitted from the second light-emitting region 112 are extracted from, for example, the transparent electrode 106 side (i.e., the transparent substrate 102 side). Due to the configuration, the light emitted from the first light-emitting region 110 and the light emitted from the second light-emitting region 112 are extracted in the same direction, and the luminance of the emitted light that is extracted from one side of the device may be enhanced thereby.

The direction of light extraction is not limited to the above configuration. The emitted light may be extracted from the transparent electrode 106 (transparent substrate 102) side, or may be extracted from both the transparent electrode 106 (transparent substrate 102) side and the rear electrode 108 (rear substrate 104) side.

In the organic electroluminescent device 100 according to the present exemplary embodiment that has the above configuration, when a voltage is applied between the transparent electrode 106 and the rear electrode 108 by a voltage application device 118 such that the transparent electrode 106 serves as an anode and the rear electrode 108 serves as a cathode, electric current flows from the transparent electrode 106 to the rear electrode 108 through the first light-emitting region 110, as a result of which electrons and holes recombine at the light emitting layer 110B to emit light, as shown in FIG. 2A. On the other hand, a voltage having a polarity different from the polarity of the voltage that causes light emission of the second light-emitting region 112 is applied to the second light-emitting region 112, as a result of which electrons and holes are not injected into the light emitting layer 112B and light emission does not occur in the light emitting layer 112B.

Subsequently, when a voltage having the reversed polarity is applied between the transparent electrode 106 and the rear electrode 108 by a voltage application device 118 such that the transparent electrode 106 serves as a cathode and the rear electrode 108 serves as an anode, electric current flows from the rear electrode 108 to the transparent electrode 106 through the second light-emitting region 112, as a result of which electrons and holes recombine at the light emitting layer 112B to emit light, as shown in FIG. 2B. On the other hand, a voltage having a polarity different from the polarity of the voltage that causes light emission of the first light-emitting region 110 is applied to the first light-emitting region 110, as a result of which electrons and holes are not injected into the light emitting layer 110E and light emission does occur in the light emitting layer 110B.

Then, the polarity of the voltage applied between the transparent electrode 106 and the rear electrode 108 is repeatedly reversed. As a result, the first light-emitting region 110 and the second light-emitting region 112 alternately emit light by the switching between the positive and negative voltages. That is, the organic electroluminescent device according to the present exemplary embodiment is driven such that one of the first light-emitting region 110 or the second light-emitting region 112 emits light while the other one of the first light-emitting region 110 or the second light-emitting region 112 does not emit light, by switching, between positive and negative, the voltage applied between the transparent electrode 106 and the rear electrode 108.

The voltage application device 118 as a driving unit may be a pulse voltage application device that switches the applied voltage between positive and negative. The time it takes to change the polarity of the voltage (pulse width: the duration of light emission from one of the light-emitting regions) may be, for example, from 100 nsec to 100 msec. The voltage applied may be, for example, from 3 V to 30 V, and the current density may be, for example, from 1 mA/cm$^2$ to 20000 mA/cm$^2$.

In the organic electroluminescent device 100 according to the present exemplary embodiment described above, the first light-emitting region 110 and the second light-emitting region 112, the polarities of the voltages required for light emission of which are mutually different, are disposed between a pair of electrodes—the transparent electrode 106 and the rear electrode 108—as common electrodes. Thus, when a voltage is applied between the transparent electrode 106 or the rear electrode 108, one of the first light-emitting region 110 or the second light-emitting region 112 emits light while the other one of the first light-emitting region 110 or the second light-emitting region 112 does not emit light.

When the polarity of the voltage applied between the transparent electrode 106 and the rear electrode 108 is reversed, the other one of the first light-emitting region 110 or the second light-emitting region 112 emits light while the one of the first light-emitting region 110 or the second light-emitting region 112 does not emit light. Therefore, the organic electroluminescent device 100 as a whole has, for example, a continuous light emission function without experiencing a non-light emitting state (i.e., a 100% light emission duty), while a non-light emitting time (resting time) is provided to each of the light-emitting regions (for example, a non-light emitting time (resting time) that is half the total light emitting time of the device is provided to each of the light-emitting regions), and thus accumulation of charges in each of the light-emitting regions may be reduced.

In the organic electroluminescent device 100 according to the present exemplary embodiment, even if a non-luminescent region called dark spot are generated and enlarged, the non-luminescent region may not extend beyond one light-emitting region since light emitting area is divided into the light-emitting regions. For example, suppose that the device has two first light-emitting regions 110 and two second light-emitting regions 112 (four light-emitting regions in total) and that a dark spot is generated and enlarged in one of the light-emitting regions, the light emitting function is impaired in the one light-emitting region only, and the other three light-emitting regions may maintain their functions.

In the organic electroluminescent device 100 according to the present exemplary embodiment, when a voltage is applied between the transparent electrode 106 and the rear electrode 108 as a pair of electrodes, one of the first light-emitting region 110 or the second light-emitting region 112 enters a state in which a voltage having the polarity that causes light emission is applied, while the other one of the first light-emitting region 110 or the second light-emitting region 112 enters a state in which a voltage having a polarity different from the voltage polarity that causes light emission is applied.

That is, a reverse bias, which is opposite to the forward bias causing light emission, is applied to a light-emitting region during the non-luminescent time thereof. Therefore, although substantial charge accumulation occurs in the light-emitting region during each light emission, the reverse bias applied during the non-luminescent time decreases the accumulated charges. Similarly, although a substantial amount of ionic components contained in the layers constituting the light-emitting region moves into other layers in the light-emitting region during each light emission, the reverse bias applied during the non-luminescent time may facilitate returning of the transferred ionic components to the original layer.

In the organic electroluminescent device 100 according to the present exemplary embodiment is described to have a configuration having one first light-emitting region 110 and one second light-emitting region 112 that differ in the polarity of the voltage that causes light emission. Although the organic electroluminescent device 100 according to the present exemplary embodiment may have a configuration having one first light-emitting region 110 and one second light-emitting region 112, the organic electroluminescent device 100 may alternatively have a configuration including plural first light-emitting regions 110 and/or plural second light-emitting regions 112. When the organic electroluminescent device 100 has a configuration having plural first light-emitting regions 110 and plural second light-emitting regions 112, the arrangement of the first light-emitting regions 110 and the second light-emitting regions 112 may be, for example, an arrangement in which the first light-emitting regions 110 and the second light-emitting regions 112 are alternately disposed linearly as shown in FIG. 3, or an arrangement in which the first light-emitting regions 110 and the second light-emitting regions 112 are alternately disposed in each of the X direction and the Y direction that intersects (for example, is perpendicular to) the X direction, as shown in FIG. 4 (the figure shows an example of disposing the light-emitting regions in the form of a 4×4 block check).

Figure 3:
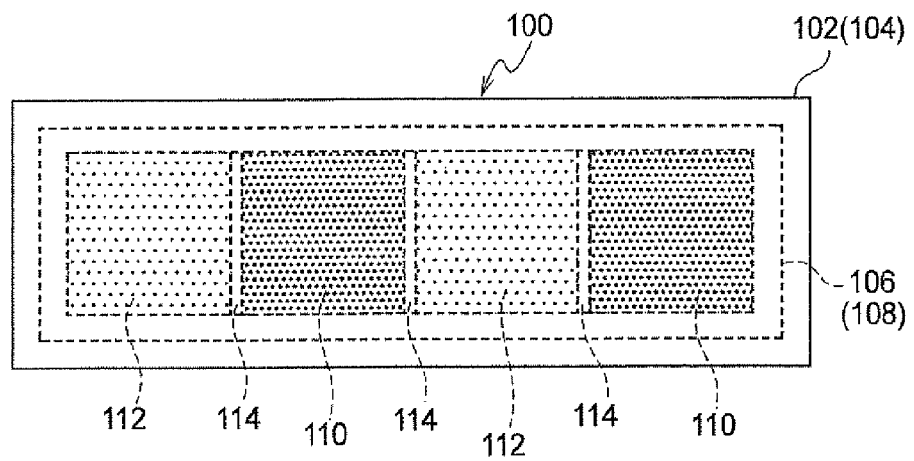
FIG. 3 is a schematic diagram showing an example of the arrangement of a first light-emitting region and a second light-emitting region in the organic electroluminescent device according to the present exemplary embodiment.
Figure 4:
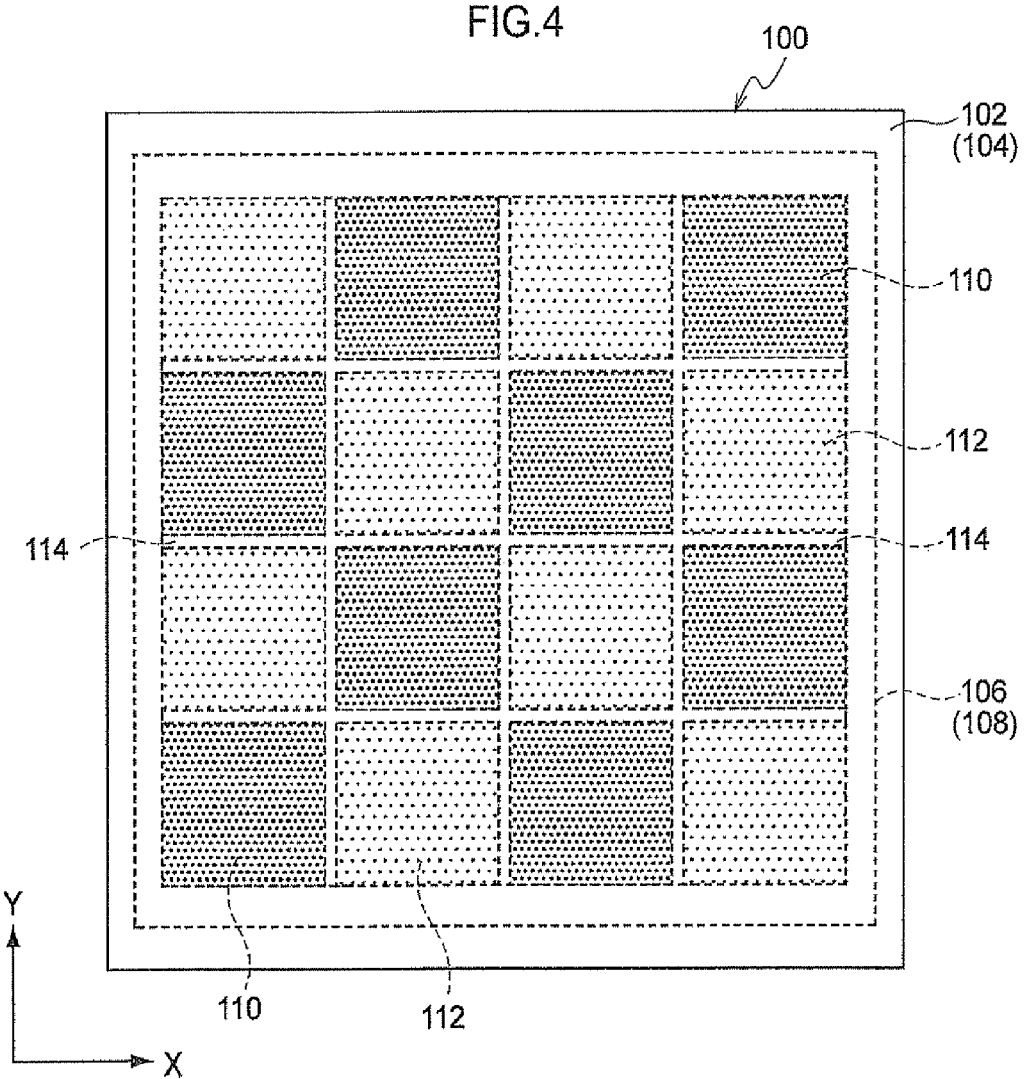
FIG. 4 is a schematic diagram showing another example of the arrangement of the first light-emitting region and the second light-emitting region in the organic electroluminescent device according to the present exemplary embodiment.

As shown in the above FIG. 3 and FIG. 4, when the first light-emitting regions 110 and the second light-emitting regions 112 are provided between the transparent electrode 106 and the rear electrode 108 and are alternately arranged in a direction intersecting (for example, perpendicular to) the direction in which the transparent electrode 106 and the rear electrode 108 face each other, localization of areas that are emitting light and areas that are not emitting light at one time point may be suppressed, and the luminance irregularity of the emitted light that is extracted from one side of the device may be reduced.

Figure 5:
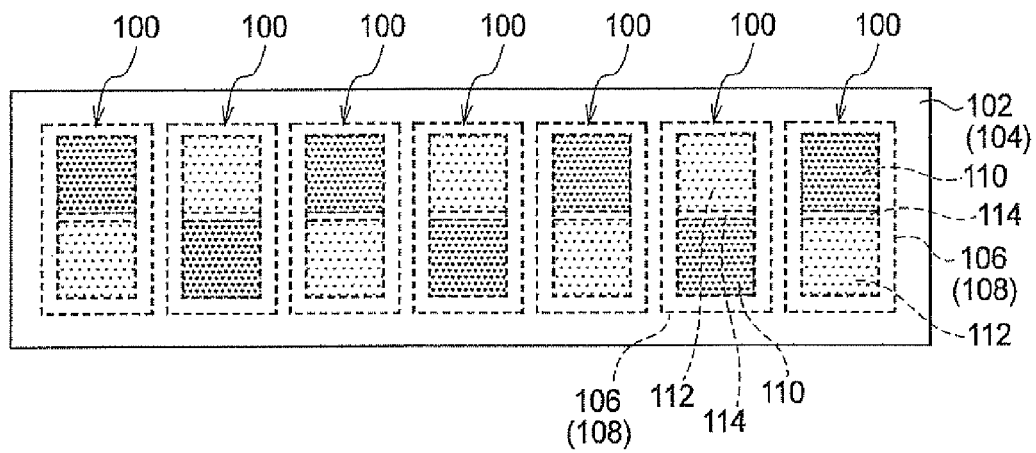
FIG. 5 is a schematic diagram showing an example of the arrangement of the organic electroluminescent device according to the present exemplary embodiment of the invention.
Figure 6:
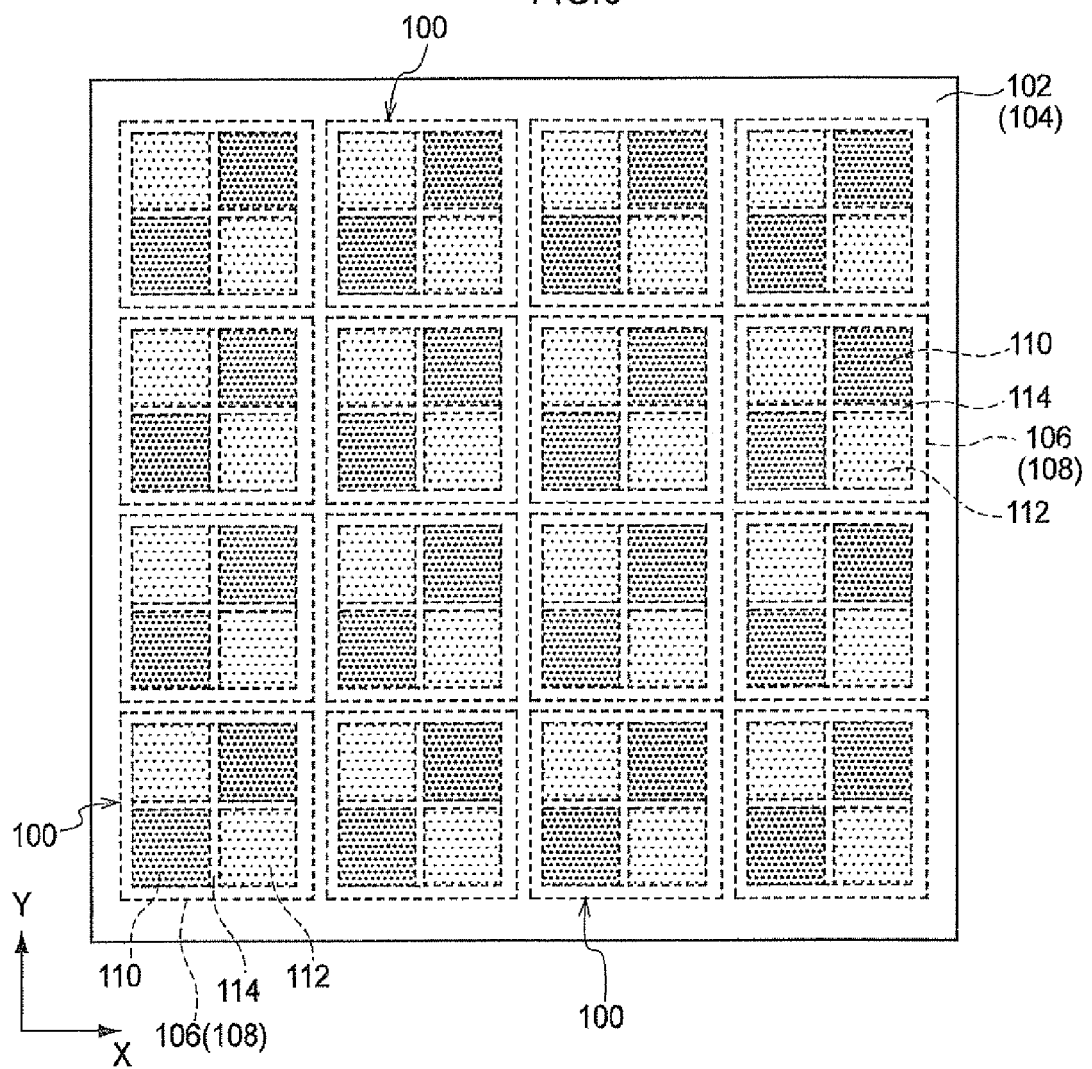
FIG. 6 is a schematic diagram showing another example of the arrangement of the organic electroluminescent device according to the present exemplary embodiment.

In the case of applying the organic electroluminescent device 100 according to the present exemplary embodiment to a display apparatus, an exposure device, an illumination apparatus or the like, the arrangement of the devices themselves may be similar to the arrangement of the first light-emitting regions 110 and the second light-emitting regions 112. Specifically, examples of the arrangement include an arrangement in which the organic electroluminescent devices 100 are aligned linearly such that the first light-emitting regions 110 and the second light-emitting regions 112 of adjoining devices are alternately disposed as shown in FIG. 5 (the figure shows an example in which devices each having one first light-emitting region 110 and one second light-emitting region 112 are arranged linearly), or an arrangement in which the organic electroluminescent devices 100 are disposed in each of the X direction and the Y direction that intersects (for example, is perpendicular to) the X direction such that the first light-emitting regions 110 and the second light-emitting regions 112 of adjoining devices are alternately arranged in each of the X direction and the Y direction as shown in FIG. 6 the figure shows an example in which devices each having first light-emitting regions 110 and second light-emitting regions 112 arranged in the form of a 2×2 block check are arranged in a 2×2 form).

The layers constituting each of the light-emitting regions in the organic electroluminescent device 100 according to the present exemplary embodiment may have well known configurations. An example of the configurations of the layers are described below, in which the description of reference numerals are omitted.

First, the transparent substrate and the rear substrate will be described.

The transparent substrate and the rear substrate each may be an insulating transparent substrate, and examples thereof include a glass substrate and a resin substrate. A non-transparent substrate may be applied as the rear substrate disposed at the side from which emitted light is not extracted.

Here, the term "transparent" means that the transmittance of light in the visible region is 10% or higher, and the transmittance is more preferably 75% or higher. The term "insulating" means that the volume resistivity is $10^{13}$ Ω·cm or higher. The same applies hereinafter.

The barrier layer is described below.

The material contained in the barrier layer may be an insulating material, and examples of the insulating material include epoxy resins, acrylic resins, polyimide resins and other thermosetting or ultraviolet-curable materials.

The transparent electrode is described below.

Examples of the transparent electrode include an oxide film (such as a film of indium tin oxide (ITO), tin oxide (MESA), indium oxide, or zinc oxide), and a metal film (such as a film of gold, platinum, aluminum, or palladium).

The rear electrode is described below.

The rear electrode disposed at the side from which emitted light is not extracted may be a non-transparent electrode. The rear electrode may have a function as a reflective layer. For example, a metal film (for example, a film of magnesium, aluminum, silver, indium, or an alloy thereof) that is thicker than the transparent electrode may be used.

The conductive layer is described below. Examples of the conductive layer include a metal film (for example, a film of gold, platinum, aluminum, or palladium). If the conductive layer is located at the light-extraction side of the light emitting layer, the conductive layer may be transparent.

The hole injection layer is described below.

Examples of the hole injection material contained in the hole injection layer include phenylenediamine derivatives (such as MTDATA (4,4',4"-tris(3-methylphenylphenylamino)triphenylamine)), phthalocyanine derivatives (such as copper phthalocyanine), indanthrene derivatives, polyaniline derivatives, polyalkylenedioxythiophene derivatives (such as PEDOT (polyethylenedioxythiophene) and PSS (polystyrene sulfonate)), inorganic oxides (such as molybdenum oxide ($MoO_3$) and vanadium pentoxide ($V_2O_5$)), and mixtures thereof.

The hole transport layer is described below.

Examples of the hole transport material contained in the hole transport layer include tetraphenylenediamine derivatives, triphenylamine derivatives, carbazole derivatives, stilbene derivatives, arylhydrazone derivatives and porphyrin-based compounds. Specific examples include the compounds represented by Formulas (I-1) to (I-6) presented below. In the Formulas (I-1) to (1-6), n represents an integer of 1 or greater.

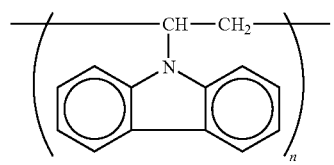

(I-1)

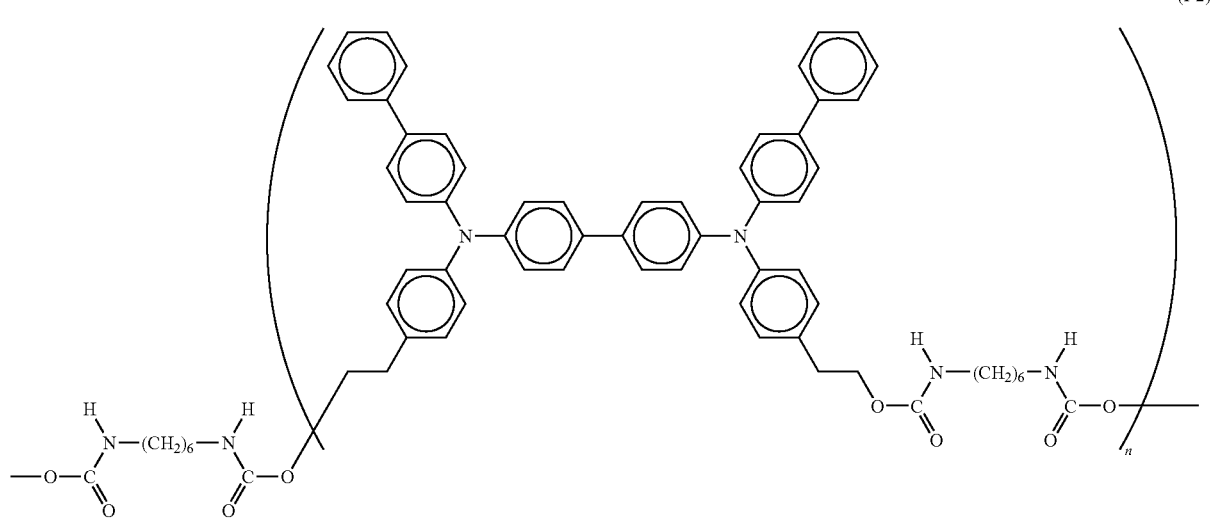

(I-2)

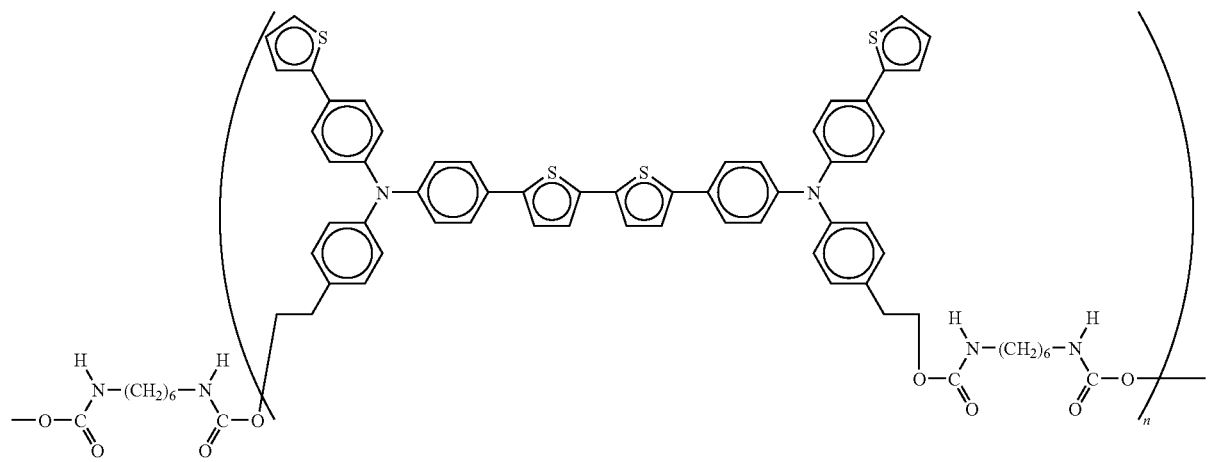

(I-3)

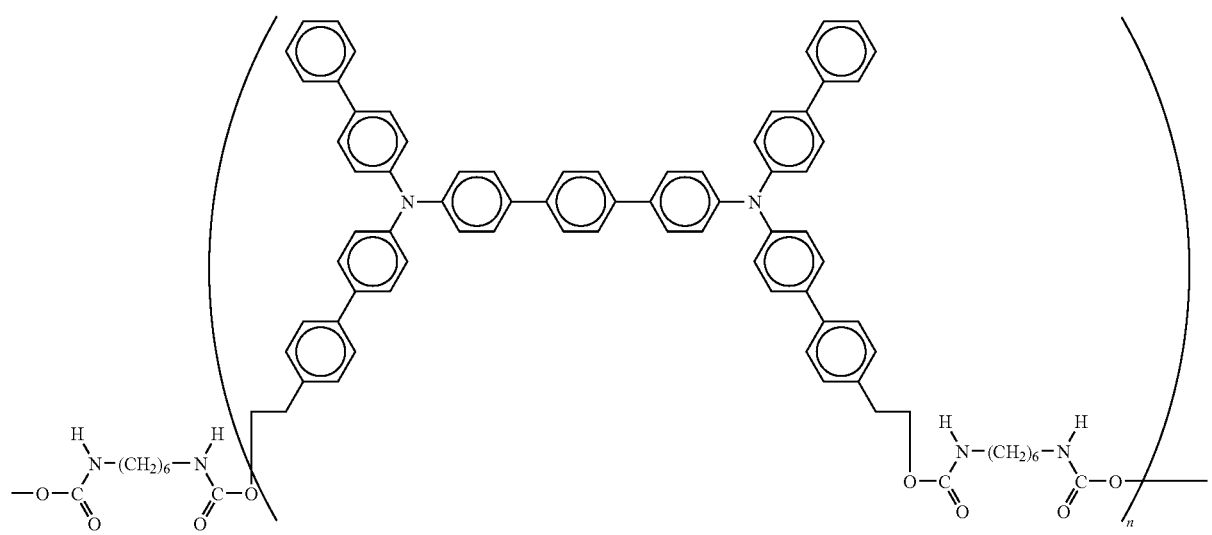

(I-4)

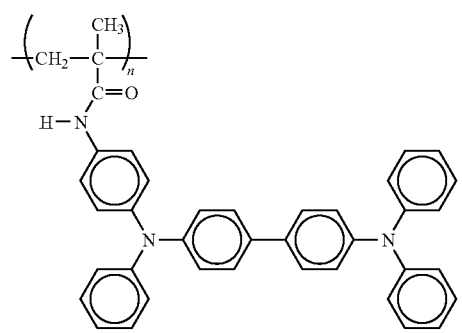

(I-5)

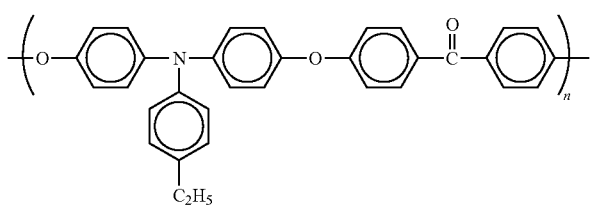

(I-6)

The light emitting layer is described below.

The luminescent material contained in the light emitting layer may be a compound exhibiting a higher fluorescence quantum yield in the solid state than in other states, and examples thereof include a low-molecular-weight luminescent material and a macromolecular luminescent material. Examples of the low-molecular-weight luminescent material include chelate-type organometallic complexes, polynuclear or condensed aromatic ring compounds, perylene derivatives, coumarin derivatives, styrylarylene derivatives, silole derivatives, oxazole derivatives, oxathiazole derivatives and oxadiazole derivatives. Examples of the macromolecular luminescent material include polyparaphenylene derivatives, polyparaphenylenevinylene derivatives, polythiophene derivatives and polyacetylene derivatives. Specific suitable examples include the following compounds represented by Formulas (II-1) to (II-17), but are not limited thereto.

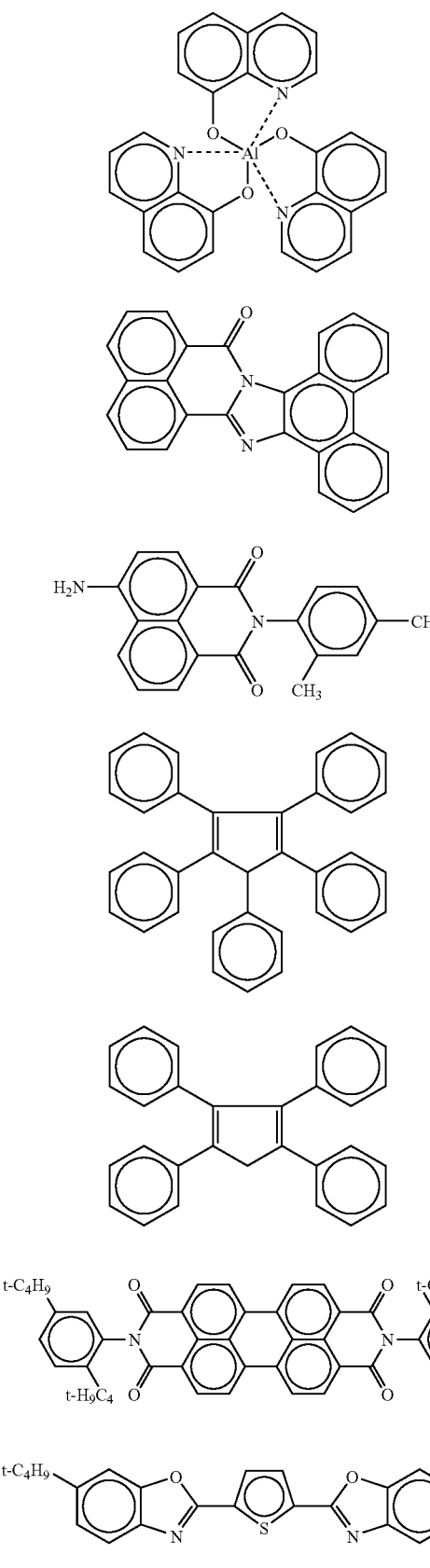
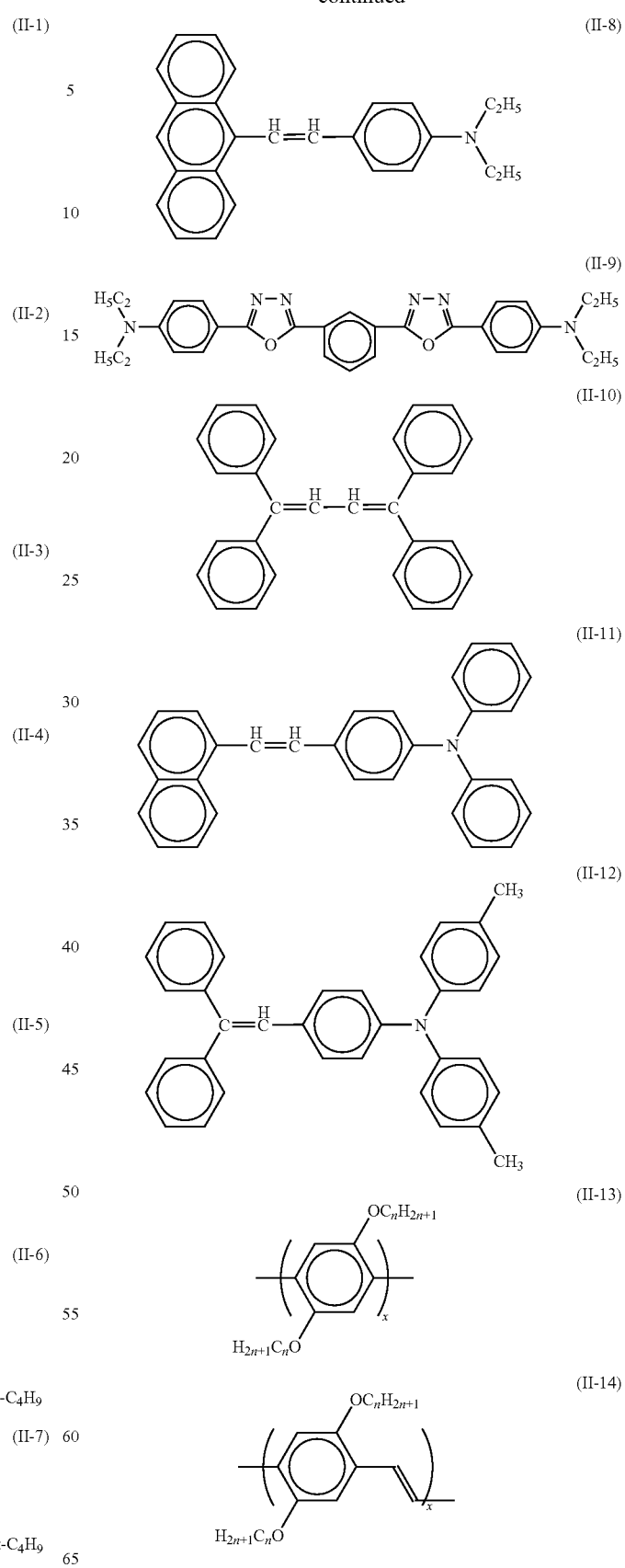

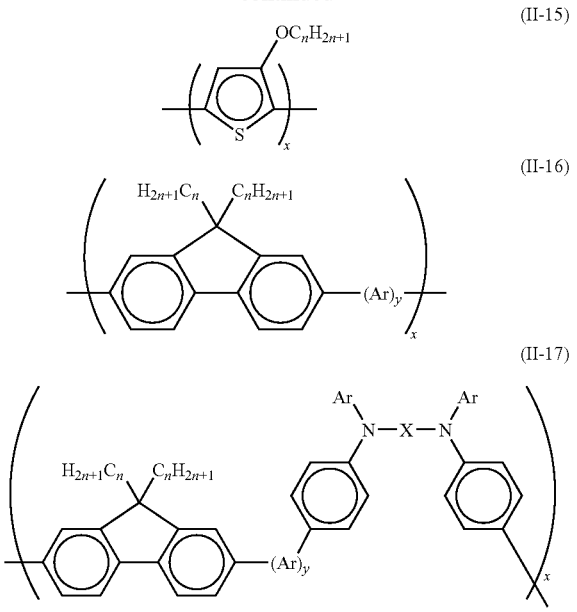

In compounds represented by Formulas (II-1) to (II-17), Ar represents a substituted or unsubstituted phenyl group, a substituted or unsubstituted monovalent polynuclear aromatic hydrocarbon having from 2 to 10 aromatic rings, a substituted or unsubstituted monovalent condensed aromatic hydrocarbon having from 2 to 10 aromatic rings, or a substituted or unsubstituted monovalent aromatic heterocyclic ring.

In compounds represented by Formulas (II-1) to (II-17), X represents a substituted or unsubstituted divalent aromatic group. Specifically, X represents a substituted or unsubstituted phenylene group, a substituted or unsubstituted divalent polynuclear aromatic hydrocarbon having from 2 to 10 aromatic rings, a substituted or unsubstituted divalent condensed ring aromatic hydrocarbon having from 2 to 10 aromatic rings, a substituted or unsubstituted divalent aromatic heterocyclic ring, or a substituted or unsubstituted divalent aromatic group containing at least one kind of aromatic heterocyclic ring.

In the Formulas (II-1) to (II-17), n and x each independently represent an integer of 1 or larger, and y represents 0 or 1.

The polynuclear aromatic hydrocarbon, condensed aromatic hydrocarbon, and aromatic heterocyclic ring are not particularly limited. The polynuclear aromatic hydrocarbon, condensed aromatic hydrocarbon and aromatic heterocyclic ring according to the present exemplary embodiment specifically have the meanings described below.

That is, the "polynuclear aromatic hydrocarbon" represents a hydrocarbon having from 2 to 10 aromatic rings composed of carbon and hydrogen, in which the rings are linked to one another via carbon-carbon bonds. Specific examples thereof include biphenyl and terphenyl.

The "condensed aromatic hydrocarbon" represents a hydrocarbon having two or more aromatic rings composed of carbon and hydrogen, in which adjacent rings share a pair of carbon atoms. Specific examples thereof include naphthalene, anthracene, phenanthrene and fluorene.

The "aromatic heterocyclic ring" represents an aromatic ring further containing an element other than carbon and hydrogen. The scope of the term "aromatic heterocyclic ring" includes an aromatic ring substituted with a heterocyclic ring, as well as a heterocyclic ring substituted with an aromatic ring. The heterocyclic ring may be a heterocyclic ring in which the number of atoms constituting the ring skeleton of the heterocyclic ring (Nr) is 5 or 6. The type and number of the atom or atoms (heteroatom(s)) that are other than the carbon atoms and that are contained in the ring skeleton of the heterocyclic ring are not particularly limited. For example, each heteroatom may be a sulfur atom, a nitrogen atom, an oxygen atom, a selenium atom or a silicon atom. The ring skeleton of the heterocyclic ring may contain two or more heteroatoms, which may be of one type or of two or more types. Examples of heterocyclic rings having a 5-membered ring structure include thiophene, pyrrole, furan, selenophene, and silole, and heterocyclic rings in which the carbon atoms at the 3-position and the 4-position of the aforementioned compounds are replaced by nitrogen. Examples of heterocyclic rings having a 6-membered ring structure include pyridine.

If a group selected as the structure representing Ar or X has a substituent, the substituent may be a hydrogen atom, an alkyl group, an alkoxyl group, an aryl group, an aralkyl group, a substituted amino group, or a halogen atom.

The alkyl group may have from 1 to 10 carbon atoms, and examples thereof include a methyl group, an ethyl group, a propyl group, an isopropyl group and a tertiary butyl group.

The alkoxyl group may have from 1 to 10 carbon atoms, and examples thereof include a methoxy group, an ethoxy group, a propoxy group and an isopropoxy group.

The aryl group may have from 6 to 20 carbon atoms, and examples thereof include a phenyl group and a toluoyl group.

The aralkyl group may have from 7 to 20 carbon atoms, and examples thereof include a benzyl group and a phenethyl group.

The substituent for the substituted amino group may be an alkyl group, an aryl group or an aralkyl group, and specific examples thereof include those mentioned above.

The halogen atom may be a fluorine atom, a chlorine atom, a bromine atom, or an iodine atom, and among them, a fluorine atom is preferable.

The substituted or unsubstituted phenyl group, the substituted or unsubstituted monovalent condensed aromatic hydrocarbon having from 2 to 10 aromatic rings, and the substituted or unsubstituted monovalent aromatic heterocyclic ring may be as described above.

The light emitting layer may be configured to include a binder resin, if the luminescent material is a low-molecular-weight luminescent material. The light emitting layer may also include, as a guest material added (doped) to the luminescent material, a colorant compound different from the luminescent material, for the purpose of enhancing the durability of the organic electroluminescent device or enhancing the luminescence efficiency. The proportion of the added (doped) colorant compound in the light emitting layer is, for example, approximately from 0.001% by weight to 40% by weight, and preferably from 0.001% by weight to 10% by weight. The colorant compound used for this addition (doping) may be an organic compound that has good compatibility with the luminescent material and that does not inhibit satisfactory thin film formation of the light emitting layer, and examples thereof include a 4-dicyanomethylene-2-methyl-6-(p-dimethylaminostyryl)-4H-pyrane (DCM) derivative, a quinacridone derivative, a rubrene derivative, and porphyrin. Specific examples thereof include compounds represented by the following Formulas (III-1) to (III-5), but are not limited thereto.

(III-1)
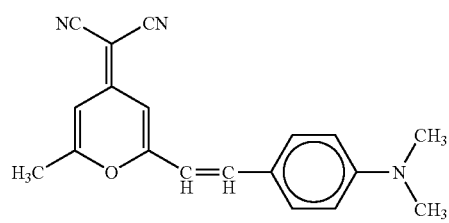

(III-2)
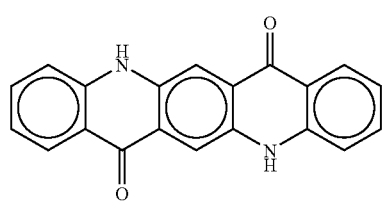

(III-3)
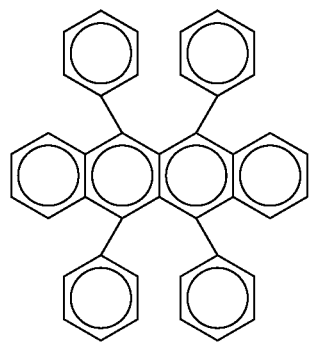

(III-4)
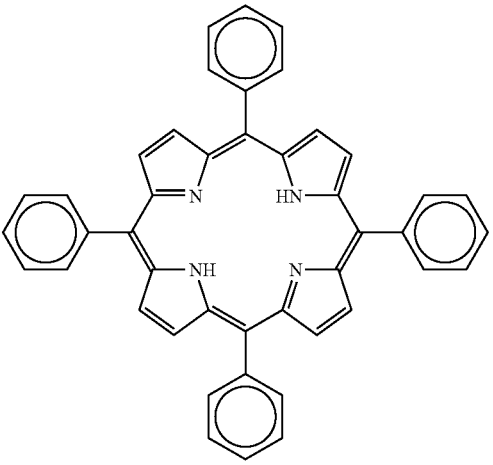

(III-5)
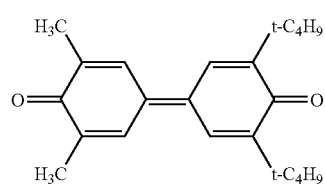

The electron transport layer is described below.

The electron transport material contained in the electron transport layer may be an oxadiazole derivative, a nitro-substituted fluorenone derivative, a diphenoquinone derivative, a thiopyrane dioxide derivative, and a fluorenylidenemethane derivative. Specific examples thereof include compounds represented by the following Formulas (IV-1) to (IV-3), but are limited thereto.

(IV-1)
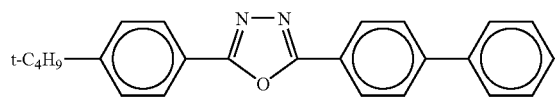

(IV-2)
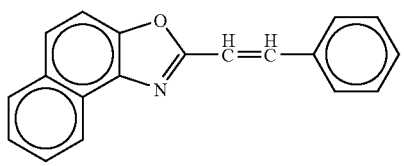

(IV-3)
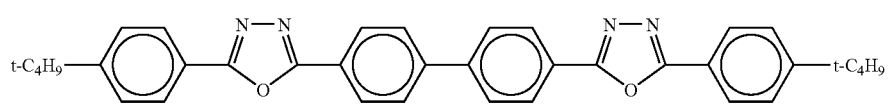

The electron injection layer is described below.

The electron injection material contained in the electron injection layer may be, for example, a metal (for example, Li, Ca or Sr), a metal fluoride (for example, LiF or $MgF_2$), a metal oxide (for example, MgO, $Al_2O_3$ or LiO), or a mixture thereof.

Each of the layers described above may be formed using, for example, a deposition method, a spray method (for example, an electrospray method), a spin coating method or a dipping method, in accordance with the constituent materials.

(Image Forming Apparatus, Process Cartridge and Exposure Device)

Figure 7:
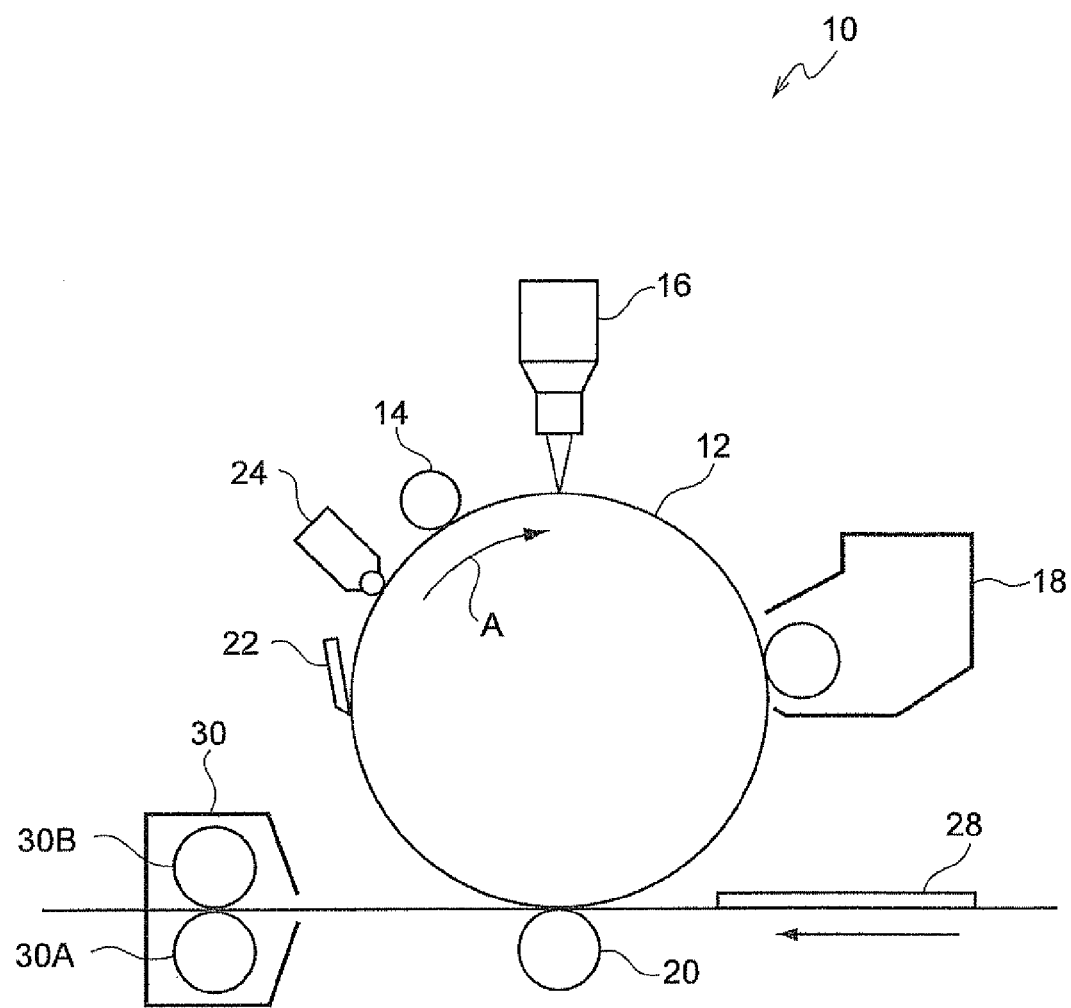
FIG. 7 is an outline view of the configuration of an image forming apparatus according to an exemplary embodiment.
Figure 8:
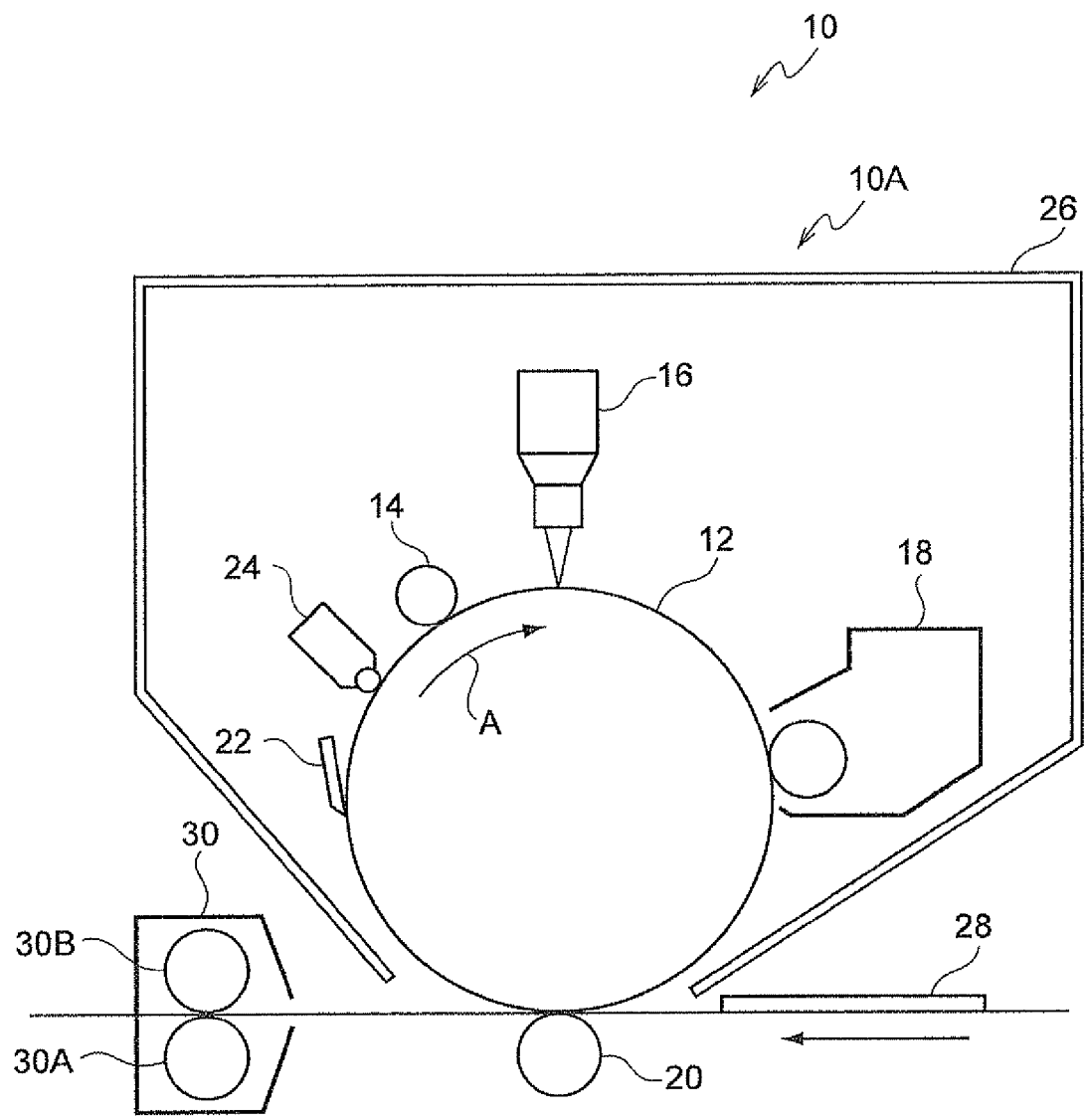
FIG. 8 is an outline view of the configuration of an image forming apparatus according to another exemplary embodiment.
Figure 9:
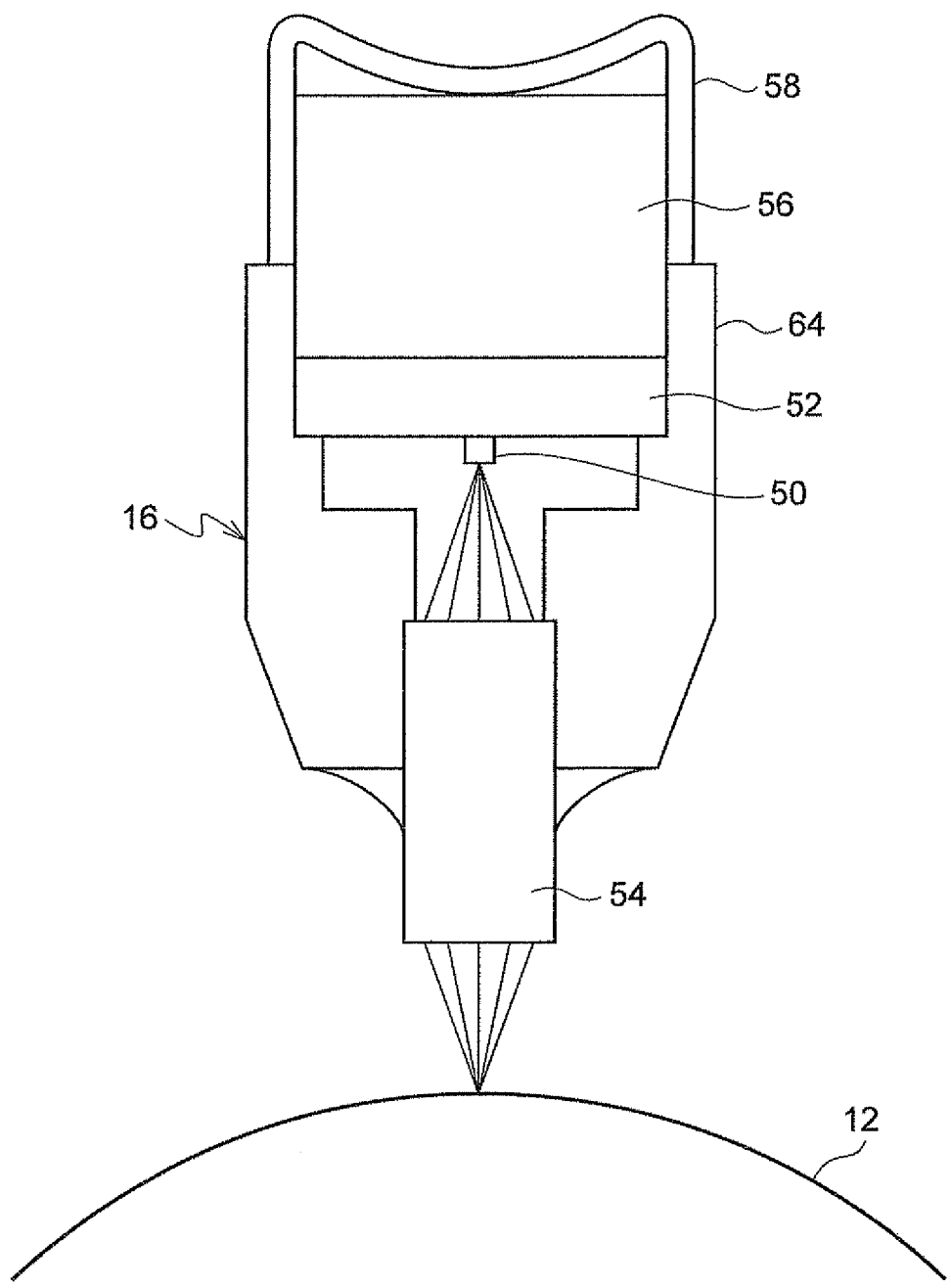
FIG. 9 is an outline view of the configuration of an exposure device according to an exemplary embodiments.

FIG. 7 is an outline view showing the configuration of an image forming apparatus according to an exemplary embodiment. FIG. 8 is an outline view showing the configuration of an image forming apparatus according to another exemplary embodiment. FIG. 9 is an outline view showing the configuration of an exposure device according to an exemplary embodiment.

The image forming apparatus 10 according to the present exemplary embodiment includes a cylindrical photoreceptor 12 (image holder) that rotates in the direction of arrow A, as shown in FIG. 7.

Around the photoreceptor 12, a charging device 14 that charges a surface of the photoreceptor 12, an exposure device 16 that exposes the surface of the photoreceptor 12 charged by the charging device 14 to light so as to form an electrostatic latent image, a developing device 18 that develops the electrostatic latent image with a developer to form a toner image, a transfer device 20 that transfers the toner image to paper 28 (recording medium), a cleaning device 22 that removes residual toner remaining on the photoreceptor 12 after the transfer, and a charge eraser 24 that eliminates charge from the photoreceptor 12, are disposed in this order along the direction of rotation of the photoreceptor 12.

A surface of the photoreceptor 12 is charged by the charging device 14, and then is irradiated with light by the exposure device 16, whereby a latent image is formed on the photoreceptor 12. The exposure device 16 is connected with a driving unit (not shown) so that the driving unit controls the emission of light and so that light is emitted based image data.

Toner is supplied by the developing device 18 to the formed latent image, so that a toner image is formed on the photoreceptor 12. The toner image on the photoreceptor 12 is transferred onto conveyed paper 28 by the transfer device 20. After the transfer, toner remaining on the photoreceptor 12 is removed by the cleaning device 22, and the charge is removed by the charge eraser 24. Then, the photoreceptor is charged again by the charging device 14, and the above processes are repeated.

The paper 28 to which the toner image has been transferred is conveyed to a fixing device 30 (fixing unit) having a pressing member 30A and a heating member 30B, and is subjected to a fixing treatment. Thereby, the toner image is fixed to form a desired image on the paper 28. The paper 28 on which the image is formed is discharged from the apparatus.

The configuration of the image forming apparatus 10 is not limited to the configuration described above. For example, the image forming apparatus may be an image forming apparatus using a tandem system or an image forming apparatus using another system.

A portion of the configuration of the image forming apparatus 10 may be contained in a casing 26 and integrated to take a form of a process cartridge 10A that is attachable to and detachable from the image forming apparatus 10, as shown in FIG. 8. The process cartridge 10A may have a configuration in which at least a photoreceptor 12 and an exposure device 16 are contained in a casing 26 and integrated. In the present exemplary embodiment, an exemplary configuration in which a photoreceptor 12, a charging device 14, an exposure device 16, a developing device 18, a cleaning device 22 and a charge eraser 24 are contained in a casing 26 and integrated is shown.

Next, the configuration of an exposure device 16 will be described in detail. as shown in FIG. 9, the exposure device 16 includes, for example, an organic electroluminescent device array 50; a substrate 52 which supports the organic electroluminescent device array 50 and on which a circuit (not depicted) for transmitting various signals that control the driving of the organic electroluminescent device array 50 is formed; and, for example, a SELFOC Lens Array 54 (hereinafter referred to as SLA 54) composed of an assembly of microlenses.

The substrate 52 is disposed in the casing 56 such that the surface of the substrate 52 to which the organic electroluminescent device array 50 is attached faces the photoreceptor 12, and the substrate 52 is supported by a plate spring 58.

The organic electroluminescent device array 50 is configured by, although not depicted, plural unit array chips arranged in series along the direction of the axial line of the photoreceptor 12, and light is irradiated at a specific resolution in the direction of the axial line of the photoreceptor 12. The unit array chips are each configured by plural organic electroluminescent devices 60 arranged in a line shape, a matrix shape or a segment shape (see, for example, FIG. 7 and FIG. 8).

The SLA 54 is supported by an SLA holder 64, and focuses the rays projected from the respective organic electroluminescent devices 60 to produce an image on the photoreceptor 12.

Here, the organic electroluminescent devices 100 described above is applied as the organic electroluminescent devices 60, which are the light source of the exposure device 16 having the configuration described above.

(Display Apparatus)

The display apparatus according to the present exemplary embodiment may be an apparatus including the organic electroluminescent device 100 described above and a voltage application device 118 (voltage application unit) as a driving unit that is connected to a pair of electrodes (transparent electrode 106 and rear electrode 108) of the organic electroluminescent device 100 and that applies a direct current voltage between the pair of electrodes (see FIG. 1).

Although a configuration of a minimum unit (one pixel unit) of the display apparatus of the present exemplary embodiment has been described above, a display apparatus having arrayed pixel units (organic electroluminescent devices) that may be arranged in a matrix shape or a segment shape, for example, may be applied as the display apparatus according to the present exemplary embodiment (see FIG. 5). When the organic electroluminescent devices are arranged in a matrix shape in the display apparatus according to the present exemplary embodiment, the configuration may be such that only the electrodes are arranged in a matrix shape or such that both the electrodes and the light-emitting regions (organic compound layers) are arranged in a matrix shape. When the organic electroluminescent devices are arranged in a segment shape in the present exemplary embodiment, the configuration may be such that only the electrodes are arranged in a segment shape or such that both the electrodes and the light-emitting regions (organic compound layers) are arranged in a segment shape.

In regard to the driving mode of the display apparatus, conventional known technologies may be applied. For example, the driving mode may be, for example, simple matrix driving in which plural row electrodes and column electrodes are arranged, and, while the row electrodes are scan-driven, column electrodes are collectively driven in accordance with the image data corresponding to the respective row electrodes; or active matrix driving using pixel electrodes provided in each pixel.

EXAMPLES

In what follows, the invention is described with reference to examples. However, the invention is not restricted to the examples.

Hereinafter, the invention will be described by way of Examples. The invention is not intended to be limited to these Examples.

Example 1

A substrate obtained by forming an ITO electrode (transparent electrode) having a size of 20×20 μm and a thickness of 100 nm on a glass substrate (transparent substrate) is prepared, and the prepared substrate is washed using a neutral detergent, acetone and isopropyl alcohol.

Subsequently, a barrier layer having a width of 1 μm and a thickness of 100 nm is formed by a photolithography process using polyimide, such that the surface of the ITO electrode is partitioned at the center into two sub-areas each having a size of 10×20 μm.

Subsequently, on the surface of one sub-area of the ITO electrode, a hole injection layer, a light emitting layer, an electron injection layer, and a conductive layer are formed in this order using a metal mask as follows: the hole injection layer has a thickness of 5 mm and is formed by depositing $MoO_3$, the light emitting layer has a thickness of 60 nm and is formed by depositing Alq3 ((tris(8-hydroxyquinolinato)aluminum) complex), the electron injection layer has a thickness of 30 nm and is formed by depositing Ca, and the conductive layer has a thickness of 5 nm and is formed by depositing Al. This is used as a first light-emitting region.

Subsequently, on the surface of the other sub-area of the ITO electrode, a conductive layer, an electron injection layer, a light emitting layer, and a hole injection layer are formed in this order using a metal mask as follows: the conductive layer has a thickness of 5 nm and is formed by depositing Al, the electron injection layer has a thickness of 30 nm and is formed by depositing Ca, the light emitting layer has a thickness of 60 nm and is formed by depositing Alq3, and the hole injection layer has a thickness of 5 nm and is formed by depositing $MoO_3$. This is used as a second light-emitting region.

Subsequently, Al is deposited over the entire surfaces of the first light-emitting region (conductive layer), the second light-emitting region (hole injection layer) and the barrier layer, thereby forming a rear electrode having a thickness of 150 nm.

Thus, an organic electroluminescent device is prepared.

Example 2

An organic electroluminescent device is prepared in the same manner as in Example 1, except for the following processes. A barrier layer having a width of 10 μm and a thickness of 100 nm is formed such that the surface of the ITO electrode is partitioned into 4-by-4 sub-areas (16 sub-areas in total), and the first light-emitting regions and the second light-emitting regions are respectively formed such that the first light-emitting regions are formed on eight sub-areas and the second light-emitting regions are formed on the other eight sub-areas and such that the first light-emitting regions and the second-light emitting regions are alternately disposed in the directions of arrangement (disposed in a block check shape).

Example 3

An organic electroluminescent device is obtained in the same manner as in Example 1, except for the following processes.

Alq3 as a host material and coumarin as a doping material are co-deposited to obtain a light emitting layer having a thickness of 50 nm and having a coumarin concentration of 5% by weight. Subsequently, Alq3 only is deposited to a thickness of 10 nm as an electron transport layer. The resultant is used as a first light-emitting region.

Alq3 is deposited to a thickness of 10 nm as an electron transport layer. Then, Alq3 as a host material and coumarin as a doping material are co-deposited to obtain a light emitting layer having a thickness of 50 nm and having a coumarin concentration of 5% by weight. The resultant is used as a second light-emitting region.

Example 4

A substrate obtained by forming an ITO electrode (transparent electrode) having a size of 20×20 μm and a thickness of 100 nm on a glass substrate (transparent substrate) is prepared, and the prepared substrate is washed using a neutral detergent, acetone and isopropyl alcohol.

Subsequently, a barrier layer having a width of 1 μm and a thickness of 100 nm is formed by a photolithography process using polyimide, such that the surface of the ITO electrode is partitioned at the center into two sub-areas each having a size of 10×20 μm.

Subsequently, on the surface of one sub-area of the ITO electrode, a hole injection layer having a thickness of 5 nm is formed by depositing $MoO_3$ on the surface of one partitioned part of the ITO electrode, using a metal mask. Then, a light emitting layer having a thickness of 60 nm is formed by ejecting a PPV solution by an inkjet method. Subsequently, an electron injection layer and a conductive layer are formed in this order as follows: the electron injection layer has a thickness of 30 nm and is formed by depositing Ca, and the conductive layer has a thickness of 5 nm and is formed by depositing Al. The resultant is used as a first light-emitting region.

Subsequently, on the surface of the other sub-area of the ITO electrode, a conductive layer and an electron injection layer are formed using a metal mask as follows: the conductive layer has a thickness of 5 nm and is formed by depositing Al, and the electron injection layer has a thickness of 30 nm and is formed by depositing Ca. Subsequently, a light emitting layer having a thickness of 60 nm is formed by ejecting a PPV solution using an inkjet method in a nitrogen-purged glove box such that the Ca surface is not oxidized. Then, a hole injection layer having a thickness of 5 nm is formed by depositing $MoO_3$. The resultant is used as a second light-emitting region.

Subsequently, Al is deposited over the entire surfaces of the first light-emitting region (conductive layer), the second light-emitting region (hole injection layer) and the barrier layer, thereby forming a rear electrode having a thickness of 150 nm.

Thus, an organic electroluminescent device is prepared.

Comparative Example 1

An organic electroluminescent device is prepared in the same manner as in Example 1, except for the following processes. The ITO electrode is not partitioned, and, on the entire surface of the ITO electrode, a hole injection layer, a light emitting layer, an electron injection layer, and a rear electrode are formed in this order as follows: the hole injection layer has a thickness of 5 nm and is formed by depositing $MoO_3$, the light emitting layer has a thickness of 60 nm and is formed by depositing Alq3, the electron injection layer has a thickness of 30 nm and is formed by depositing Ca, and the rear electrode has a thickness of 155 nm and is formed by depositing Al.

(Evaluation 1)

The following evaluations are performed on the prepared organic electroluminescent devices.

(Evaluation of Device Lifespan)

The produced devices are driven at a driving voltage that is adjusted to provide an initial luminance of emitted light of 5000 $cd/m^2$. The devices of the Examples are driven by switching the polarity of the voltage at 10 kHz, while the device of the Comparative Example is driven with DC. The time it takes until the initial luminance is halved is measured.

(Evaluation of Dark Spot)

With regard to pixels that exhibits dark spots due to particles at the initial light emission, enlargement of the dark spots are evaluated at the time the luminance becomes half the initial luminance. The evaluation criteria are as follows.

A: Less than 10% of the light-emitting region
B: Less than 25% of the light-emitting region
C: Less than 50% of the light-emitting region
D: Enlarged to 50% or more, or having become incapable of emitting light

TABLE 1

|  | Device lifespan | Dark spot |
| --- | --- | --- |
| Example 1 | 59 | B |
| Example 2 | 70 | A |
| Example 3 | 95 | B |
| Example 4 | 65 | C |
| Comparative Example 1 | 40 | C |

From the results shown above, it is understood that in the Examples, the lifespan of device is extended as compared with the Comparative Example, and generation and enlargement of dark spots hardly occur.

(Evaluation 2)

The organic electroluminescent devices produced in Example 1, the number of which is 1024, are arranged in lines to have dimensions of 20 μm×20 μm, and are incorporated into an image forming apparatus (DOCUPRINT C2250 manufactured by Fuji Xerox Corp.) as a light source for an exposure device (see FIG. 9). The organic electroluminescent devices produced in Comparative Example 1, the number of which is 1024, are arranged in lines to have dimensions of 20 μm×20 μm, and are incorporated into an image forming apparatus (DOCUPRINT C2250 manufactured by Fuji Xerox Corp.) as a light source for an exposure device (see FIG. 9). Then, the following evaluation is performed.

The organic electroluminescent devices produced in Example 1 are arranged such that the first light-emitting region of one device and the second light-emitting region of an adjacent device adjoin each other in the direction of arrangement.

(Evaluation of Streak-Shaped Irregularity)

An evaluation of the image quality is performed with respect to streak-shaped irregularity, which is caused by pixel omission or luminescence irregularity. The evaluation criteria are as follows.

A: Very good
B: Good
C: Streak-shaped irregularity occurs
D: Streak-shaped irregularity occurs extensively

TABLE 2

|  | Streaks irregularity |
| --- | --- |
| Example 1 | B |
| Example 2 | A |
| Example 3 | B |
| Example 4 | B |
| Comparative Example 1 | C |

From the results shown above, it is understood that when the organic electroluminescence devices are applied to an exposure device in the Examples, pixel omission or luminescence irregularity is suppressed, and therefore, occurrence of streaks irregularity is suppressed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An organic electroluminescent device comprising:
   a pair of electrodes including a rear electrode and a transparent electrode;
   a first light-emitting region that (1) is disposed between the pair of electrodes, (2) has a first multilayered structure having at least, from a transparent electrode side toward a rear electrode side, (i) at least one of: a hole injection layer or a hole transport layer, and (ii) a light emitting layer, in this order, and (3) emits light only when a voltage is applied between the pair of electrodes such that the transparent electrode serves as an anode; and
   a second light-emitting region that (1) is different from the first light-emitting region, (2) is disposed between the pair of electrodes, (3) has a second multilayered structure having at least, from the rear electrode side toward the transparent electrode side, (i) at least one of: a hole injection layer or a hole transport layer, and (ii) a light emitting layer, in this order, and (4) emits light only when a voltage is applied between the pair of electrodes such that the rear electrode serves as an anode.

2. The organic electroluminescent device according to claim 1, wherein lights emitted from the first light-emitting region and the second light-emitting region have the same direction of extraction.

3. The organic electroluminescent device according to claim 1, wherein a plurality of the first light-emitting regions and a plurality of the second light-emitting regions are provided, and the first light-emitting regions and the second light-emitting regions are alternately arranged between the pair of electrodes, in a direction intersecting the direction in which the pair of electrodes face each other.

4. The organic electroluminescent device according to claim 1, wherein when a voltage is applied between the pair of electrodes, the voltage has a polarity that causes light emission from one of the first light-emitting region or the second light-emitting region, and that is different from a polarity that causes light emission from the other one of the first light-emitting region or the second light-emitting region.

5. The organic electroluminescent device according to claim 1, wherein the first multilayered structure has, from the transparent electrode side toward the rear electrode side, (i) a hole injection layer, (ii) a light emitting layer, and (iii) an electron injection layer, in this order.

6. The organic electroluminescent device according to claim 1, wherein the first multilayered structure has, from the transparent electrode side toward the rear electrode side, (i) at least one of: a hole injection layer or a hole transport layer, (ii) a light emitting layer, and (iii) at least one of: an electron injection layer or an electron transport layer, in this order.

7. The organic electroluminescent device according to claim 1, wherein the second multilayered structure has, from the rear electrode side toward the transparent electrode side, (i) a hole injection layer, (ii) a light emitting layer, and (iii) an electron injection layer, in this order.

8. The organic electroluminescent device according to claim 1, wherein the second multilayered structure has, from the rear electrode side toward the transparent electrode side, (i) at least one of: a hole injection layer or a hole transport layer, (ii) a light emitting layer, and (iii) at least one of: an electron injection layer or an electron transport layer, in this order.

9. The organic electroluminescent device according to claim 1, wherein a first conductive layer is disposed between the first light-emitting region and the rear electrode, and a second conductive layer is disposed between the second light-emitting region and the transparent electrode.

10. An exposure device comprising the organic electroluminescent device according to claim 1.

11. A process cartridge comprising:
the exposure device of claim 10;
an image holder; and
an electrostatic latent image forming unit that exposes a surface of the image holder to light so as to form an electrostatic latent image,
the process cartridge being attachable and detachable from an image forming apparatus.

12. An image forming apparatus comprising:
the exposure device of claim 10;
an image holder;
a charging unit that charges a surface of the image holder;
an electrostatic latent image forming unit that exposes the surface of the image holder so as to form an electrostatic latent image;
a developing unit that develops the electrostatic latent image as a toner image by a developer;
a transferring unit that transfers the toner image to a recording medium; and
a fixing unit that fixes the toner image transferred to the recording medium.

13. A display apparatus comprising the organic electroluminescent device according to claim 1.

14. An illumination apparatus comprising the organic electroluminescent device according to claim 1.

15. A method for driving an organic electroluminescent device comprising:
applying a voltage between the pair of electrodes of the organic electroluminescent device according to claim 1 to drive the organic electroluminescent device such that one of the first light-emitting region or the second light-emitting region emits light, and the other one of the first light-emitting region or the second light-emitting region does not emit light; and
changing the polarity of the voltage applied between the pair of electrodes to drive the organic electroluminescent device such that the other one of the first light-emitting region or the second light-emitting region to emit light, and the one of the first light-emitting region or the second light-emitting region does not emit light.

16. The method for driving an organic electroluminescent device according to claim 15, wherein the driving is performed by a pulse voltage application device.

* * * * *